US010153155B2

(12) United States Patent
Nishida et al.

(10) Patent No.: US 10,153,155 B2
(45) Date of Patent: Dec. 11, 2018

(54) DOPED FERROELECTRIC HAFNIUM OXIDE FILM DEVICES

(71) Applicant: University of Florida Research Foundation, Inc., Gainesville, FL (US)

(72) Inventors: Toshikazu Nishida, Gainesville, FL (US); Mohammad Takmeel, Gainesville, FL (US); Saeed Moghaddam, Gainesville, FL (US); Patrick Lomenzo, Gainesville, FL (US)

(73) Assignee: UNIVERSITY OF FLORIDA RESEARCH FOUNDATION, INCORPORATED, Gainesville, FL (US)

( * ) Notice: Subject to any disclaimer, the term of this patent is extended or adjusted under 35 U.S.C. 154(b) by 11 days.

(21) Appl. No.: 15/286,946

(22) Filed: Oct. 6, 2016

(65) Prior Publication Data

US 2017/0103988 A1 Apr. 13, 2017

Related U.S. Application Data

(60) Provisional application No. 62/239,807, filed on Oct. 9, 2015.

(51) Int. Cl.
*H01L 21/28* (2006.01)
*H01L 21/02* (2006.01)
(Continued)

(52) U.S. Cl.
CPC .......... *H01L 21/0228* (2013.01); *G11C 11/22* (2013.01); *G11C 11/221* (2013.01);
(Continued)

(58) Field of Classification Search
CPC ......... H01L 21/28291; H01L 21/02181; H01L 29/516; H01L 29/6684; H01L 27/11502;
(Continued)

(56) References Cited

U.S. PATENT DOCUMENTS

| 8,003,511 | B2 | 8/2011 | Rinerson et al. |
| 8,031,510 | B2 | 10/2011 | Schloss et al. |

(Continued)

FOREIGN PATENT DOCUMENTS

KR 20150037009 A * 4/2015

OTHER PUBLICATIONS

Böscke et al., Ferroelectricity in hafnium oxide thin films. Appl Phys Lett. Sep. 2011;99: 102903.1-3.
(Continued)

*Primary Examiner* — Michele Fan
(74) *Attorney, Agent, or Firm* — Alston & Bird LLP

(57) ABSTRACT

Techniques for forming an electronic device having a ferroelectric film are described. The electronic device comprises a ferroelectric material having one or more crystalline structures. The one or more crystalline structures may comprise hafnium, oxygen, and one or more dopants. The one or more dopants are distributed in the ferroelectric material to form a first layer, a second layer, and a third layer. The second layer is positioned between the first layer and the third layer. Distribution of one or more dopants within the first layer, the second layer, and the third layer may promote a crystalline structure to have an orthorhombic phase.

16 Claims, 7 Drawing Sheets

(51) Int. Cl.
    *H01L 29/51*     (2006.01)
    *H01L 29/66*     (2006.01)
    *H01L 29/423*     (2006.01)
    *G11C 11/22*     (2006.01)
    *H01L 49/02*     (2006.01)

(52) U.S. Cl.
    CPC ...... *H01L 21/022* (2013.01); *H01L 21/02148* (2013.01); *H01L 21/02181* (2013.01); *H01L 21/02189* (2013.01); *H01L 21/02194* (2013.01); *H01L 21/02321* (2013.01); *H01L 21/02356* (2013.01); *H01L 21/28291* (2013.01); *H01L 28/40* (2013.01); *H01L 29/42364* (2013.01); *H01L 29/516* (2013.01); *H01L 29/517* (2013.01); *H01L 29/6684* (2013.01); *H01L 28/56* (2013.01)

(58) Field of Classification Search
    CPC . H01L 21/02148; H01L 29/51; H01L 21/385; H01L 21/225
    See application file for complete search history.

(56) References Cited

U.S. PATENT DOCUMENTS

| | | | |
|---|---|---|---|
| 8,208,284 | B2 | 6/2012 | Schloss |
| 9,053,801 | B2 | 6/2015 | Sandhu et al. |
| 2003/0042527 | A1 | 3/2003 | Forbes et al. |
| 2004/0248371 | A1 | 12/2004 | Wang |
| 2005/0048728 | A1* | 3/2005 | Kawahara ......... H01L 21/28194 438/287 |
| 2005/0151210 | A1 | 7/2005 | Li et al. |
| 2007/0048953 | A1 | 3/2007 | Gealey et al. |
| 2008/0230854 | A1 | 9/2008 | Clark |
| 2009/0008726 | A1* | 1/2009 | Yamauchi ......... H01L 21/82380 257/412 |
| 2009/0057737 | A1 | 3/2009 | Boescke et al. |
| 2010/0159641 | A1 | 6/2010 | Rinerson et al. |
| 2011/0002154 | A1* | 1/2011 | Mitani ............... G11C 13/0007 365/148 |
| 2011/0024875 | A1 | 2/2011 | Takebayashi et al. |
| 2011/0165401 | A1 | 7/2011 | Chalker et al. |
| 2011/0291066 | A1 | 12/2011 | Baek et al. |
| 2011/0297927 | A1 | 12/2011 | Ramaswamy et al. |
| 2012/0126195 | A1 | 5/2012 | Ignatiev et al. |
| 2012/0211716 | A1 | 8/2012 | Meyer |
| 2013/0330902 | A1 | 12/2013 | Chen et al. |
| 2014/0061764 | A1 | 3/2014 | Takashima et al. |
| 2014/0070289 | A1 | 3/2014 | Tanaka et al. |
| 2014/0077336 | A1 | 3/2014 | Chiang et al. |
| 2014/0153312 | A1 | 6/2014 | Sandhu et al. |
| 2015/0076437 | A1 | 3/2015 | Tao et al. |
| 2015/0340372 | A1* | 11/2015 | Pandey .............. H01L 27/1159 257/295 |
| 2016/0005961 | A1* | 1/2016 | Ino ................... H01L 45/04 257/4 |
| 2016/0064225 | A1* | 3/2016 | Kim ................. H01L 29/511 438/591 |
| 2016/0133727 | A1* | 5/2016 | Hashemi ......... H01L 29/66795 257/288 |
| 2016/0372478 | A1* | 12/2016 | Ino ................... C23C 14/083 |

OTHER PUBLICATIONS

Böscke et al., Ferroelectricity in Hafnium Oxide: CMOS Compatible Ferroelectric Field Effect Transistors. IEEE. Dec. 5-7, 2011;24.5.1-4.

Clima et al., Identification of the ferroelectric switching process and dopant-dependent switching properties in orthorhombic HfO2: A first principles insight. Appl Phys Lett. Mar. 2014;104:092906.1-4.

Lomenzo et al., Ferroelectric phenomena in Si-doped HfO2 thin films with TiN and Ir electrodes. Vac Sci Technol B. Apr. 25, 2014;32:03D123.1-8.

Lomenzo et al., TaN interface properties and electric field cycling effects on ferroelectric Si-doped $HfO_2$ thin films. J Appl Phys. 2015;117:134105.1-10.

Lomenzo et al., The effects of layering in ferroelectric Si-doped $HfO_2$ thin films. Appl Phys Lett. Aug. 2014;105:072906.1-5.

Ma et al., Why is nonvolatile ferroelectric memory field-effect transistor still elusive? IEEE Electron Device Lett. Jul. 7, 2002;23(7):386-8.

Müller et al., Ferroelectric Hafnium Oxide: A Game Changer to FRAM? 14th Annual Non-Volatile Memory Technology Symposium (NVMTS). Oct. 27-29, 2014;1-7.

Müller et al., Ferroelectric $Zr_{0.5}Hf_{0.5}O_2$ thin films for nonvolatile memory applications. Appl Phys Lett. 2011;99:112901.1-3.

Müller et al., Ferroelectricity in Gd-Doped $HfO_2$ Thin Films. ECS J Solid State Sci Technol. 2012;1(6):N123-6.

Müller et al., Ferroelectricity in yttrium-doped hafnium oxide. J Appl Phys. Dec. 7, 2011;110(11):114113.1-5.

Müller et al., Incipient Ferroelectricity in Al-Doped $HfO_2$ Thin Films. Adv Funct Mater. Jun. 6, 2012;22(11):2412-7.

Park et al., Evolution of phases and ferroelectric properties of thin Hf0. 5Zr0. 5O2 films according to the thickness and annealing temperature. Appl Phys Lett. Jun. 2013;102(24):242905.1-5.

Park et al., The effects of crystallographic orientation and strain of thin $Hf_{0.5}Zr_{0.5}O_2$ film on its ferroelectricity. Appl Phys Lett. Jan. 2014;104:072901.1-5.

Polakowski et al., Ferroelectric deep trench capacitors based on Al:HfO2 for 3D nonvolatile memory applications. 2014 IEEE 6th International Memory Workshop (IMW), Taipei, Taiwan. May 18-21, 2014;1-4.

Sang et al., On the structural origins of ferroelectricity in HfO2 thin films. Appl Phys Lett. 2015;106(16):162905.1-4.

Schenk et al., Strontium doped hafnium oxide thin films: Wide process window for ferroelectric memories. 2013 Proceedings of European Solid-State Device Research Conference. IEEE. Sep. 16-20, 2013;260-3.

Schroeder et al., Impact of different dopants on the switching properties of ferroelectric hafniumoxide. Jpn J Appl Phys. Jul. 10, 2014;53:08LE02.1-5.

Zhou et al., Wake-up effects in Si-doped hafnium oxide ferroelectric thin films. Appl Phys Lett. Nov. 2013;103:192904.1-4.

\* cited by examiner

DOPED FERROELECTRIC HAFNIUM OXIDE FILM DEVICES

RELATED APPLICATIONS

This application claims priority under 35 U.S.C. § 119(e) to U.S. Provisional Application Ser. No. 62/239,807, entitled "DOPED FERROELECTRIC HAFNIUM OXIDE FILM DEVICES," filed on Oct. 9, 2015, the entire contents of which is incorporated herein by reference in its entirety.

FEDERALLY SPONSORED RESEARCH

This invention was made with government support under IIP-1439644 awarded by the National Science Foundation. The government has certain rights in the invention.

BACKGROUND

Field

The present application relates to ferroelectric thin film devices.

Related Art

A ferroelectric device may include a film of ferroelectric material, such as a film positioned between two electrodes. By applying an electric field across the ferroelectric material, the ferroelectric material may become polarized and remain polarized after the electric field is reduced or removed.

BRIEF SUMMARY

In some embodiments, an electronic device is provided. The electronic device comprises a ferroelectric material having at least one crystalline structure. The at least one crystalline structure comprises atoms of hafnium, oxygen, and at least one dopant. The atoms of the at least one dopant are distributed in the at least one crystalline structure so as to form a first layer, a second layer, and a third layer. The second layer is positioned between the first layer and the third layer. The second layer has a dopant of the at least one dopant with a different ionic radius than atoms of the first layer and the third layer.

In some embodiments, a method of forming an electronic device is provided. The method comprises forming, on a first conductive layer, a film that includes atoms of hafnium and oxygen and at least two dopants within the film to form at least three dopant layers at different depths within the film. The method further comprises forming a second conductive layer on a surface of the film opposite to the first conductive layer and forming, by heating the film, a ferroelectric material having at least one crystalline structure.

In some embodiments, an electronic device is provided. The electronic device comprises a transitional metal oxide film, the film comprising a plurality of layers. The plurality of layers is defined by at least two dopants introduced in the crystal lattice of the transitional metal oxide film. The at least two dopants are distributed in the transitional metal oxide film so as to provide a dopant profile across the plurality of layers having a first region of the film with a higher concentration of a first dopant of the at least two dopants than a second dopant of the at least two dopants between regions of the film with a higher amount of the second dopant than the first dopant.

In some embodiments, an electronic device is provided. The electronic device comprises a ferroelectric material having at least one crystalline structure. The at least one crystalline structure comprising atoms of hafnium, oxygen, and a dopant. The atoms of the dopant are distributed in the at least one crystalline structure so as to form a first layer, a second layer, and a third layer. The second layer is positioned between the first layer and the third layer. The second layer has a concentration of the dopant that is smaller than the first layer and the third layer.

BRIEF DESCRIPTION OF DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

Figure 1:
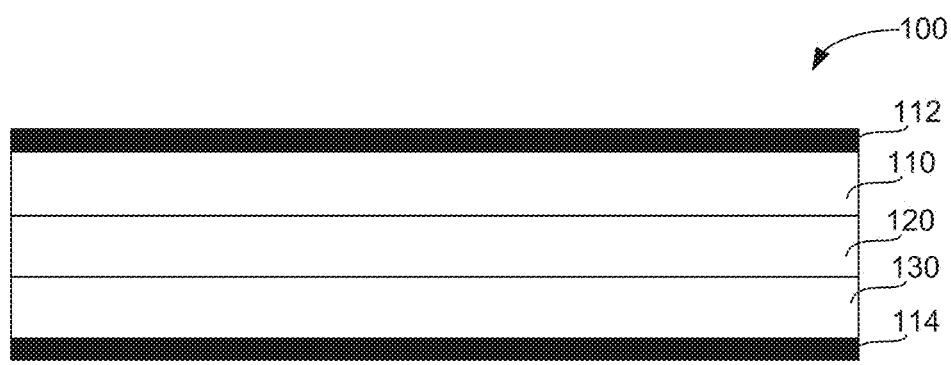
FIG. 1 is a cross-sectional diagram of an exemplary ferroelectric device, according to some embodiments.

Aspects of the present application relate to a ferroelectric film of a ferroelectric device. Polarization of some or all of the ferroelectric film may occur by applying an electric field to the ferroelectric film. The ferroelectric behavior of the film may be suitable for various devices where polarization of one or more components of a device is desired. In some embodiments, the film may have metal-ferroelectric-insulator-semiconductor (MFIS) structure or a metal-ferroelectric-semiconductor (MFS) structure, which may be used in transistor devices including ferroelectric field effect transistors (FeFETs). In some embodiments, the film may be used to form a metal-ferroelectric-metal (MFM) capacitor, which may be used in ferroelectric devices including ferroelectric random access memory (FRAM) and ferroelectric tunnel junctions (FTJs).

The performance of the ferroelectric device may depend on one or more properties of the ferroelectric film, including structure and chemical composition. Performance characteristics of a ferroelectric device may include write speed, write cycle, power consumption, and remanent polarization. Reduction in the dimensions of such ferroelectric devices may decrease the scale of the devices, which may provide increased density of one or more characteristics of a device, including a higher memory density. However, challenges may arise in reducing the scale of a ferroelectric device because one or more dimensions of the ferroelectric film in the device are also reduced. Reducing the thickness of a conventional ferroelectric film may have adverse effects on the level of performance of the resulting ferroelectric device. Interfacial depolarization fields may have a significant impact on the device's performance at smaller thicknesses for the ferroelectric film. Reduction in thickness of a ferroelectric film may decrease the polarization capabilities of the ferroelectric film and/or increase the coercive field of the ferroelectric film. As an example, a memory device based on a ferroelectric MFM capacitor with a perovskite ferroelectric material, such as lead-zirconate-titanate (PZT), may have a ferroelectric film with a thickness of approximately 120 nm to provide a desired level of performance. Scaling of such a memory device to achieve smaller dimensions and higher densities such that the ferroelectric film has a thickness of approximately 50 nm reduces the performance capabilities of the device.

Applicants have appreciated that forming a ferroelectric film to have desired performance characteristics at smaller thicknesses may improve the ability of ferroelectric devices to achieve smaller scales. One type of ferroelectric film includes hafnium and oxygen atoms, such as hafnium oxide (e.g., $HfO_2$). The ferroelectricity of hafnium oxide may increase by doping, even with a small amount of dopants (e.g., in the range of approximately 0.4 mole % to approximately 1.2 mole %). Some aspects of the present application relate to a ferroelectric film that includes one or more dopants, which may be introduced during formation of the film and promote ferroelectricity in the resulting film. Dopants may include silicon, aluminum, gadolinium, strontium, lanthanum, and/or zirconium. A ferroelectric device that includes a doped hafnium oxide ferroelectric film may have a desired level of performance for a film thickness in the range of approximately 5 nm to approximately 50 nm, or any value or range of values within that range. Such doped hafnium oxide films may be used to achieve ferroelectric devices with sufficiently thin ferroelectric films, including devices that have a metal-ferroelectric-metal (MFM) structure, a metal-ferroelectric-insulator-semiconductor (MFIS) structure, and/or a metal-ferroelectric-semiconductor (MFS) structure, which may be otherwise difficult to achieve with thicker films. Some aspects of the present application relate to a ferroelectric device that includes a hafnium oxide film doped with one or more dopants.

Applicants have also appreciated that the crystalline structure of a ferroelectric film may impact the film's ferroelectric properties. In accordance with some embodiments, a ferroelectric film may have a crystalline structure that substantially forms the ferroelectric film. In other embodiments, a ferroelectric film may have multiple crystalline structures and may be considered to have a polycrystalline structure that includes multiple crystalline grains. Aspects of the present application relate to a ferroelectric film have one or more crystalline structures.

In accordance with some embodiments, a ferroelectric film may have a predominately crystalline structure. In some embodiments, a crystalline structure of the ferroelectric film may have an orthorhombic phase. However, it is not a requirement that the entire film be uniformly crystalline or polycrystalline. A lattice structure of a crystal, for example, may be interrupted by cracks or impurities. In some embodiments, the film may be polycrystalline where crystalline regions are interrupted by grain boundaries. The grain boundaries may have a random and/or textured orientation. The crystalline regions may account for greater than 75% by volume of the film, in some embodiments. In other embodiments, the crystalline regions may account for greater than 80%, 85%, 90%, 95% or 98% of the volume of the film. In some embodiments, the crystalline regions may account for a volume of the ferroelectric film in the range of 70% to 100%, or any value or range of values within that range.

Some crystalline structures may provide improved ferroelectric properties. A ferroelectric film formed to include one or more layers with different crystalline structures may improve the ferroelectric behavior of the film. In some embodiments, the layers may be differentiated based on differences in volume of a lattice cell. Such differences may result from processing used to crystallize the film or by the materials used to form the film. For example, different crystalline structures may be formed by introducing different types or concentrations of dopant in different regions of the film. The layers may be differentiated based on a predominate dopant. For example, dopant atoms with different ionic radii may be introduced into a crystalline structure to define different layers. In some embodiments, dopant atoms may be incorporated into the crystal lattice. For example, in some embodiments, an oxide film may contain layers in which silicon and aluminum atoms are incorporated into the crystal lattice of the oxide as dopants. Alternatively or additionally, the layers may be differentiated based on the dopant concentration, with different amounts of dopant atoms incorporated in different layers of the film. For example, in one layer, Zr atoms may be incorporated into a hafnium oxide crystal with a ratio of Zr to Hf of 1:3, while in another layer the ratio may be 1:1.

In some embodiments, the crystalline structures may be formed of a transitional metal oxide. Suitable transitional metals may include hafnium or zirconium or combinations thereof. Hafnium oxide, for example, may have dielectric and/or ferroelectric properties depending on whether the hafnium oxide is crystallized. While amorphous hafnium oxide may act as a dielectric material, crystallized hafnium oxide can act as a ferroelectric material. Some aspects of the present application relate to a hafnium oxide film that includes a crystalline structure with a distribution of one or more dopants across the film that has been found to improve one or more ferroelectric characteristics, including remanent polarization. The crystal phase of a hafnium oxide film can impact the ferroelectric properties of the film. In some embodiments, the hafnium oxide film has an orthorhombic phase crystalline structure. The crystalline structure may be polycrystalline and include multiple crystalline grains.

Alternatively or additionally, conditions during growth of the ferroelectric film may impact the resulting crystalline structure for the film so as to form layers of different crystalline properties. Applying heat to the film, via thermal annealing, may transform an amorphous film into a crystalline structure with ferroelectric properties. Constraining the film by annealing while the film is in contact with another layer of material, such as a substrate or an electrode on the film may improve formation of a desired ferroelectric crystalline structure. Additionally, the chemical composition of one or more layers of a crystalline structure may impact the crystalline structure. A hafnium oxide film may include additional atoms (e.g., dopants) that may improve the crystalline structure of the film for a desired ferroelectric behavior.

The variation in the distribution of one or more materials across the film's thickness may impact the ferroelectric properties of the film by providing improved performance in a device with the ferroelectric film over a film that lacks such a spatial distribution. A ferroelectric film may have a layered structure where the different layers distribute materials within the film to achieve desired ferroelectric behavior for the film. A layer of the ferroelectric film may be defined by one or more characteristics of materials within the ferroelectric film, including dopant concentration and/or dopant type. A layer of a ferroelectric film may have a concentration of one dopant type above a certain threshold (e.g., approximately 0.4 mole %). Although a layer may have more than one dopant, the layer of the ferroelectric film may be defined by the relation between the different dopants. A layer of a ferroelectric material may be defined by having a higher concentration of a first dopant than a second dopant. The boundaries of a layer may be defined by the spatial distribution of concentration of the predominant dopant. For example, the boundaries of the layer may be deemed to be where the dopant concentration has fallen below 33% of the peak value in the layer. In some embodiments, a layer of a ferroelectric material may be defined by a method used to form the layer, including depositing material to form a layer such as by atomic layer deposition (ALD). The parameters of depositing the layer may define the amount of material of a layer and/or the thickness of the layer. An ALD process can allow for one monolayer of material to be deposited at a time and provide control for the amount of material in a layer and/or the thickness of a layer in the ferroelectric material.

Some embodiments relate to varying the amount of one or more materials across the thickness of a ferroelectric film. In some embodiments, one or more dopants are distributed within a ferroelectric film such that the amount of dopant varies across the thickness of a ferroelectric film. The spatial distribution of materials across the thickness of a ferroelectric film may impact the type of a crystalline structure of the film such that the film has a crystalline structure with desired ferroelectric properties. Such a layered ferroelectric film provides improved performance with the ability of the ferroelectric film to retain polarization at a certain level when an applied electric field is reduced. For example, in using a layered ferroelectric film to form a memory device, the number of write cycles the film can endure and retain a sufficient level of polarization may impact the ability of a ferroelectric device that includes the film to adequately store information. Accordingly, improving the remanent polarization of the film can enable improved ferroelectric memory devices. Performance may be similarly improved for other type of ferroelectric devices.

The aspects and embodiments described above, as well as additional aspects and embodiments, are described further below. These aspects and/or embodiments may be used individually, all together, or in any combination of two or more, as the application is not limited in this respect.

An exemplary electronic device 100 having a ferroelectric film is shown in FIG. 1. One of skill in the art will recognize that FIG. 1 illustrates a portion of an electronic device. The portion shown might be a portion of a larger circuit, including active elements like transistors and diodes. Those other elements might extend laterally in the orientation shown in FIG. 1. Alternatively or additionally, the other elements might extend vertically, with other layers formed above or below the illustrated layers. Such other elements may connect the structure illustrated in FIG. 1 as a capacitor or gate of a transistor, forming a memory cell. However, the specific type of electronic device into which a ferroelectric film as described herein is integrated is not a limitation of the invention. For simplicity, connections between the portion shown and other elements of the device are not expressly illustrated. One of skill in the art will understand that such elements and such connections may be formed using known semiconductor processing techniques or other suitable techniques.

In the embodiment of FIG. 1, the ferroelectric film has three layers. However, in some embodiments, the film may have more or fewer layers. The ferroelectric film includes first layer 110, second layer 120, and third layer 130. Electronic device 100 may also include first conductive layer 114 and a second conductive layer 112. The ferroelectric film is positioned between the first conductive layer 114 and the second conductive layer 112. In some embodiments, first conductive layer 114 and/or second conductive layer 112 may include one or more conductive materials and may act as an electrode. In this manner, first conductive layer 114 may act as first electrode and/or second conductive layer 112 may act as a second electrode. The first and/or second electrodes may be used to apply an electric field to the ferroelectric film. A voltage may be applied across the ferroelectric film by holding the first electrode and/or second electrode at potentials to achieve the voltage. Some or all of the ferroelectric film may become polarized and reach a polarization state in response to the applied electric field.

One or more characteristics of the ferroelectric film may allow the ferroelectric film to achieve a polarization state. First layer 110, second layer 120, and/or third layer 130 have one or more crystalline structures that include hafnium and oxygen atoms (e.g., $HfO_2$). The phase of a crystalline structure may influence the ferroelectricity of the film. Different crystal phases (e.g., monoclinic, tetragonal, orthorhombic, cubic) may exist in a ferroelectric film. A ferroelectric film may include a plurality of crystalline structures where the plurality of crystalline structures may have one or more phases.

Since some phases may provide improved ferroelectric properties over other phases, aspects of the present application include techniques that improve the ferroelectric properties of a ferroelectric material by increasing the amount of the crystalline structure having a phase that exhibits a higher level of ferroelectric properties than other phases. Accordingly, a ferroelectric material may have a higher proportion or ratio of one crystal phase over other possible crystal phases of the material. For hafnium oxide, the orthorhombic crystal phase exhibits improved ferroelectric properties over some of the other phases, such as monoclinic, tetragonal, and cubic. One or more improved characteristics of the ferroelectric film may relate to the fraction of the one or more crystalline structures that have an orthorhombic crystal phase, which may be a higher fraction using techniques as described herein than in conventional films. In some embodiments, a crystalline structure in first layer 110, second layer 120, and/or third layer 130 may have an orthorhombic phase.

The ferroelectric film may include one or more dopants. The dopant distribution within the film may impact the ferroelectric properties of the film. The crystalline phase of a crystalline structure of the film may depend on the dopant distribution within the film. A desired dopant distribution may direct a crystalline structure of the film to have a crystalline phase that provides certain ferroelectric properties of the film. In this manner, desired ferroelectric properties of the ferroelectric film can be achieved by the distribution of dopants within the ferroelectric film.

Each of the first layer 110, second layer 120, and third layer 130 may include one or more dopants such that the distribution of dopants within the ferroelectric film can be represented by doping characteristics of the first, second, and third layers. Some embodiments relate to first layer 110 and third layer 130 having different doping characteristics than second layer 120. The characteristics may include type and/or amount of dopant atoms. First layer 110 and third layer 130 may have a dopant with a different ionic radius than a dopant in second layer 120. In some embodiments, first layer 110 and third layer 130 may have a dopant with a smaller ionic radius than a dopant in the second layer 120. In some embodiments, first layer 110 and third layer 130 may have a dopant with a larger ionic radius than a dopant in the second layer 120. First layer 110 and third layer 130 may have a dopant with a different atomic radius than a dopant in second layer 120. In some embodiments, first layer 110 and third layer 130 may have a dopant with a smaller atomic radius than a dopant in the second layer 120. In some embodiments, first layer 110 and third layer 130 may have a dopant with a larger atomic radius than a dopant in the second layer 120.

Alternatively or additionally, first layer 110 and third layer 130 may have a different concentration of one or more dopants than the second layer 120. First layer 110 and third layer 130 may have a larger concentration of a first dopant than a second dopant, and second layer 120 may have a larger concentration of the second dopant than the first dopant.

One or more crystalline structures of the ferroelectric film may include one or more dopants. First layer 110, second layer 120, and third layer 130 may form layers within the one or more crystalline structures. A crystalline structure may have dimensions such that the crystalline structure spans more than one layer of the ferroelectric film. A crystalline structure may have smaller dimensions such that the crystalline structure occupies one layer or less than one layer of the ferroelectric film.

In some embodiments, the distribution of dopants within the ferroelectric film may impact lattice volumes within the one or more crystalline structures such that, by varying the distribution of dopants across the film, the lattice volume may vary across the film. First layer 110 and third layer 130 may have a different lattice volume than second layer 120. In some embodiments, first layer 110 and third layer 130 may have a larger lattice volume than second layer 120. In some embodiments, first layer 110 and third layer 130 may have a smaller lattice volume than second layer 120. The atomic radii of different dopants relative to each other may provide the stability for a crystalline structure to have an orthorhombic phase, such as by providing an in-plane tensile stress that may promote an orthorhombic phase.

Some embodiments relate to a ferroelectric film where first layer 110 and third layer 130 are doped with a first dopant and second layer 120 is doped with a second dopant. In some embodiments, first layer 110 and third layer 130 are doped with silicon, and second layer 120 is doped with aluminum. This distribution of silicon and aluminum provides a ferroelectric film with regions of predominately silicon dopant separated by a region of predominately aluminum dopant such that the regions of silicon are proximate to a substrate and/or electrode of an electronic device. Such a distribution may promote stability of one or more crystalline structures to have an orthorhombic crystal phase. Depending on the oxidation state, the ionic radius of silicon (e.g., 0.4 Å) can be smaller than the ionic radius of aluminum (e.g., 0.535 Å), which can promote one or more crystalline structures spanning first layer 110, second layer 120, and third layer 130 to have an orthorhombic phase. Regions of a crystalline structure doped with aluminum may lead to a smaller lattice volume while regions of the crystalline structure doped with silicon may lead to a larger lattice volume. The different lattice volumes may provide a suitable level of strain within the crystalline structure such that the crystalline structure has an orthorhombic phase. A crystalline structure spanning first layer 110, second layer 120, and third layer 130 may experience different lattice volumes. Doping first layer 110 and third layer 130 with silicon may form a crystalline structure with a larger lattice volume than second layer 120 doped with aluminum.

In some embodiments, first layer 110 and third layer 130 are doped with aluminum and second layer 120 is doped with silicon. As discussed above, the ionic radii of silicon and aluminum atoms may promote one or more crystalline structures to have an orthorhombic phase. The distribution of aluminum and silicon may provide a crystalline structure with a certain level of strain such that the crystalline structure has an orthorhombic phase.

Some embodiments relate to a ferroelectric film where first layer 110, second layer 120, and third layer 130 includes atoms of hafnium, oxygen, and a dopant where the concentration of the dopant is variable among layers 110, 120, and 130. The distribution of the dopant may be such that the varying concentration of the dopant across layers 110, 120, and 130 promotes an orthorhombic crystal phase in one or more crystalline structures. In some embodiments, first layer 110 and third layer 130 have a higher concentration of the dopant than second layer 120. In some embodiments, first layer 110 and third layer 130 have a smaller concentration of the dopant than second layer 120.

In some embodiments, first layer 110, second layer 120, and third layer 130 have atoms of hafnium, zirconium, and oxygen. The concentrations of hafnium and zirconium may vary such that first layer 110 and third layer 130 have a higher concentration of zirconium than second layer 120. In some embodiments, first layer 110 and third layer 130 have a molecular formula of $Hf_{0.5}Zr_{0.5}O_2$ and second layer 120 has a molecular formula of $Hf_{0.75}Zr_{0.25}O_2$.

Figure 2:
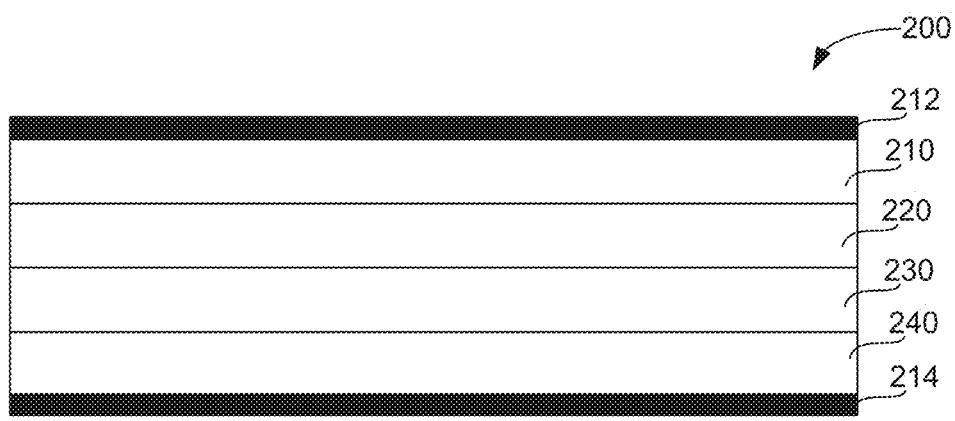
FIG. 2 is a cross-sectional diagram of an exemplary ferroelectric device, according to some embodiments.

As illustrated by the example in FIG. 2, a ferroelectric film of an electronic device may have more than three layers. FIG. 2 illustrates an exemplary electronic device 200 having a ferroelectric film includes first layer 210, second layer 220, third layer 230, and fourth layer 240. Electronic device 200 may also include first conductive layer 214 and a second conductive layer 212. The distribution of dopants across first layer 210, second layer 220, third layer 230, and fourth layer 240 may promote one or more crystalline structures to have an orthorhombic phase such that a larger proportion of crystalline structures have an orthorhombic phase over other phases (e.g., monoclinic, tetragonal, cubic).

Some embodiments relate to outer layers of a ferroelectric film having substantially similar doping characteristics that differ from the doping characteristics of one or more inner layers of the film. In some embodiments, first layer 210 and fourth layer 240 have substantially similar doping characteristics, and second layer 220 and third layer 230 have substantially similar doping characteristics that differ from first layer 210 and fourth layer 240. First layer 210 and fourth layer 240 may include a dopant with a different ionic radius than a dopant in second layer 220 and third layer 230. First layer 210 and fourth layer 240 may have a higher concentration of a first dopant than a second dopant. Second layer 220 and third layer 230 may have a higher concentration of the second dopant than the first dopant. In some embodiments, first layer 210 and fourth layer 240 are doped with silicon and second layer 220 and third layer 230 are doped with aluminum. In some embodiments, first layer 210 and fourth layer 240 are doped with aluminum and second layer 220 and third layer 230 are doped with silicon.

Some embodiments relate to layers of a ferroelectric film that alternate between having a first doping characteristic and a second doping characteristic. In some embodiments, first layer 210 and third layer 230 have substantially similar doping characteristics, and second layer 220 and fourth layer 240 have similar doping characteristics that differ from the first layer 210 and third layer 230. First layer 210 and third layer 230 may include a dopant with a different ionic radius than a dopant in second layer 220 and fourth layer 240. First layer 210 and third layer 230 may have a higher concentration of a first dopant than a second dopant. Second layer 220 and fourth layer 240 may have a higher concentration of the second dopant than the first dopant. In some embodiments, first layer 210 and third layer 230 are doped with silicon and second layer 220 and fourth layer 240 are doped with aluminum.

Aspects of the present application relate to methods of forming an electronic device with a ferroelectric film. A method may include forming on a layer of material, a film that includes layers of substantially un-doped hafnium oxide separated by layers with one or more dopants. In some embodiments, the layer of material may act as a source of dopant for the film. By heating the film, dopants may diffuse into one or more of the hafnium oxide layers from the layer of material or other dopant material. The resulting film may have a doping distribution that provides desired ferroelectric properties. In some embodiments, a layer of material under and on top of the oxide film may serve as electrodes for a capacitive cell including the ferroelectric film.

Figure 3:
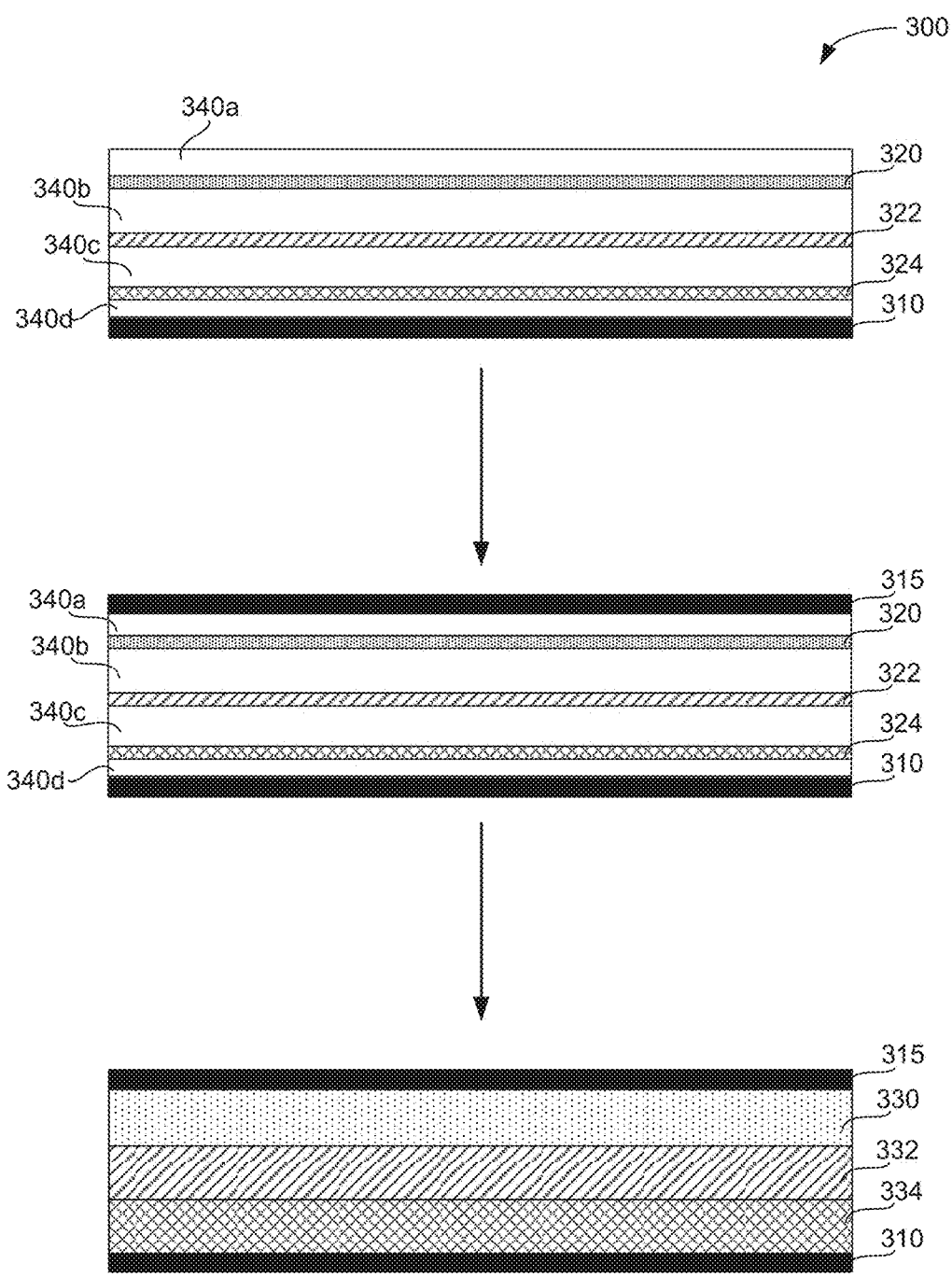
FIG. 3 illustrates an exemplary method of forming a ferroelectric device, according to some embodiments.

FIG. 3 illustrates exemplary method 300 of forming an electronic device. It should be appreciated that FIG. 3 illustrates a portion of the steps in forming an electronic device. For simplicity, steps such as patterning layers and forming active devices such as transistors and diodes are not illustrated, but may be performed using known semiconductor processing steps or in any other suitable way. Method 300 may include forming conductive layer 310. Any suitable techniques may be used to form conductive layer 310, including atomic layer deposition (ALD) and plasma-enhanced chemical vapor deposition (PECVD). In an exemplary embodiment, conductive layer 310 is formed by depositing TiN by atomic layer deposition at 200° C. on a doped silicon wafer (e.g., a p+Si wafer).

Method 300 may also include forming a film that includes hafnium oxide regions 340a, 340b, 340c, 340d with dopant layers 320, 322, 324 on conductive layer 310. The film may be formed by forming layers of hafnium oxide interspersed with dopant layers 320, 322, 324. Dopant layers 320, 322, and 324 may be spatially separated and surrounded by the hafnium oxide regions 340a, 340b, 340c, 340d. The thickness of hafnium oxide between each dopant layer may be in the range of approximately 0.5 nm to approximately 5 nm, or any value or range of values within that range. Any suitable techniques may be used to form a hafnium oxide layer and/or dopant layer, including atomic layer deposition (ALD) and/or plasma-enhanced chemical vapor deposition (PECVD). The formation of one or more layers of the film may include introducing a precursor for a type of material to deposit through ALD. ALD can allow materials to be formed monolayer by monolayer, which can provide improved quality and/or uniformity of a layer and/or of the resulting ferroelectric film. Any suitable arrangement of the layers of hafnium oxide and/or dopant may be formed by the order in which one or more precursors are introduced. Any suitable precursor may be used. Example precursors include the following: tetrakis(dimethylamido)hafnium for Hf; trimethylaluminum (TMA) for Al; tris(dimethylamino)silane for Si; tris(dimethylamino)zirconium(IV) for Zr; and tetrakis(dimethylamido)titanium(IV) for Ti. Deposition of the layers of hafnium oxide and/or dopants may occur at a temperature in a range of approximately 100° C. to approximately 300° C., or any value or range of values within that range. In some embodiments, deposition of one or more of the layers of hafnium oxide and/or dopants may occur at a temperature of approximately 200° C.

Method 300 may include forming conductive layer 315 on the film. Conductive layer 315 may be formed using any suitable technique, such as atomic layer deposition (ALD) and/or plasma-enhanced chemical vapor deposition (PECVD). In an exemplary embodiment, conductive layer 315 is formed by depositing a layer of TiN by ALD at 200° C.

In some embodiments, conductive layers 310 and 315, hafnium oxide regions 340a, 340b, 340c, 340d, and dopant layers 320, 322, 324 are all formed by ALD. By forming this structure within an ALD chamber, oxidation of the structure may be reduced, such as oxidation of an interface between the hafnium oxide and a conductive layer. Reducing oxidation may improve the quality of the resulting ferroelectric film and/or performance of the resulting electronic device.

Method 300 may include thermally annealing the film to form a ferroelectric film. Thermal annealing may allow diffusion of dopants from dopant layers 320, 322, 324 to form layers 330, 332, and 334. Crystallization of the hafnium oxide may occur by thermal annealing. A crystalline structure may include dopant atoms from one of dopant layers 320, 322, 324. Each of layers 330, 332, 334 may have a dopant of one or more of dopant layers 320, 322, 324. As illustrated in FIG. 3, layer 330 includes a dopant of dopant layer 320, layer 332 includes a dopant of dopant layer 322, and layer 334 includes a dopant of dopant layer 324. In this manner, the order and arrangement of layers in a ferroelectric film can be controlled by the formation and positioning of dopant layers within a hafnium oxide film. Forming conductive layer 315 before thermal annealing the film may promote the formation of an orthorhombic phase in one or more crystalline structures.

Any suitable thermal annealing conditions may be used. The temperature, duration, and/or gas present may influence the ferroelectric properties of the ferroelectric film. Thermal annealing of the film may occur at a temperature in the range of 400° C. to 1100° C., or any value or range of values within that range. In some embodiments, the annealing of the film may occur at a temperature in the range of 700° C. to 900° C. The annealing time may range from 1 second to 5 hours, or any value or range of values within that range. In some embodiments, the annealing time may be approximately 20 seconds. Exemplary annealing conditions include a time duration of approximately 20 seconds at a temperature of approximately 500° C., approximately 800° C., and/or approximately 900° C. The gas present during thermal annealing may include $N_2$, $O_2$, and/or $H_2$.

A ferroelectric film may have a thickness in the range of approximately 2 nm to approximately 150 nm, or any value or range of values within that range. A layer of a ferroelectric film may have a thickness in the range of approximately 0.5 nm to approximately 50 nm, or any value or range of values within that range.

Any suitable materials may be used for forming the ferroelectric films and/or devices.

One or more layers may include a material that includes at least hafnium and oxygen atoms (e.g., $HfO_2$). The material may have a formula of $Hf_xZr_yO_2$ where x and y are numbers within the range of 0 to 1 and x+y=1. Examples of such materials include $HfO_2$, $Hf_{0.5}Zr_{0.5}O_2$, $Hf_{0.75}Zr_{0.25}O_2$, and $Hf_{0.25}Zr_{0.75}O_2$. Additional examples of suitable hafnium oxide materials include $Hf_xSi_yO_z$ and $Hf_xAl_yO_z$.

One or more layers of a ferroelectric film may be doped with a suitable dopant, such as silicon, aluminum, yttrium, gadolinium, strontium, lanthanum, titanium, and tantalum. A doped layer of the ferroelectric film may have a ratio of hafnium to one or more dopants in the range of 50:1 to 5:1, or any value or range of values within that range. In some embodiments, a layer of a ferroelectric film may have a ratio of hafnium to a dopant of approximately 24:1, approximately 16:1, or approximately 12:1. The ratio of hafnium to one or more dopants may be a ratio of hafnium atoms to one or more dopant atoms. In some embodiments, the ratio of hafnium to one or more dopants may be defined by the process of forming the doped layer. In an ALD process where a layer can be formed monolayer by monolayer, the ratio of hafnium to one or more dopants may be defined by the ratio of hafnium to dopant monolayers deposited by ALD. In this manner, the ratio of hafnium to a dopant may be defined by a layering ratio of an ALD process to deposit hafnium and dopant layers and form a layer in a ferroelectric film.

The molecular percentage of silicon in a layer of a ferroelectric film may be in the range of 0.4% to 6%, or any value or range of values within that range. In some embodiments, the molecular percentage of silicon in a layer of a ferroelectric film may be in the range of 0.5% to 0.8%, or any value or range of values within that range. The molecular percentage of aluminum in a layer of a ferroelectric film may be in the range of 0.8% to 6%, or any value or range of values within that range. In some embodiments, the molecular percentage of aluminum in a layer of a ferroelectric film may be in the range of 0.8% to 1.2%, or any value or range of values within that range.

The conductive layers 112, 114, 212, 214, 310, 315 may include any suitable material. Conductive layers 112, 114, 212, 214, 310, 315 may include a conductive material and may act as an electrode for the electronic device. Conductive layers 112, 114, 212, 214, 310, 315 may include one or more materials including TiN, TaN, Ge, Si, GaAs, and GaN.

Figure 4:
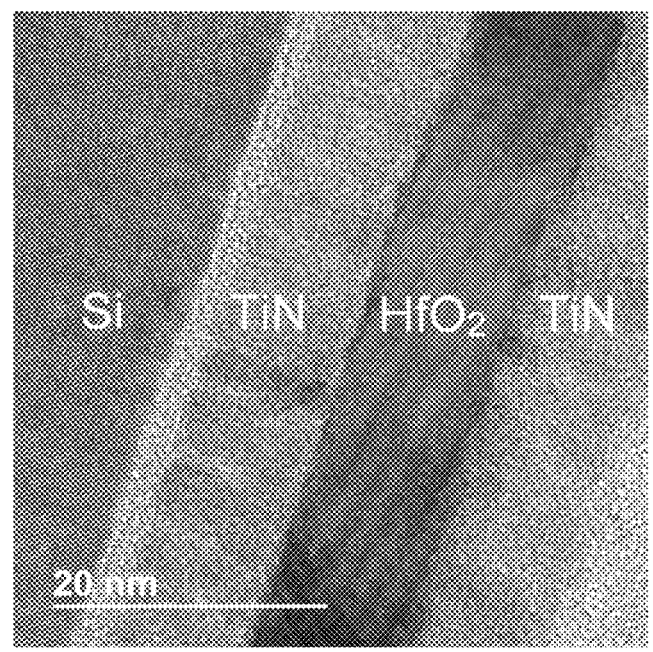
FIG. 4 is a high resolution transmission electron microscopy (HR-TEM) image of a hafnium oxide film doped with silicon and aluminum.

FIG. 4 is a high resolution transmission electron microscopy (HR-TEM) image of a hafnium oxide film after annealing at 850° C. The hafnium oxide film includes four layers, such as illustrated in FIG. 2, where first layer 210 is doped with silicon, second layer 220 is doped with aluminum, third layer 230 is doped with aluminum, and fourth layer 240 is doped with silicon. Lattice fringes can be seen in the hafnium oxide film (indicated by $HfO_2$), which indicate crystalline structures of the hafnium oxide.

FIGS. 5-9 include reference to three different exemplary devices having different ferroelectric film structures. These film structures vary in terms of order of silicon and aluminum doped layers of hafnium oxide, which will be described with reference to FIG. 2. "Si—Al—Al—Si" refers to a ferroelectric film structure where first layer 210 and fourth layer 240 are doped with aluminum and second layer 220 and third layer 230 are doped with silicon. "Al—Si—Si—Al" refers to a ferroelectric film structure where first layer 210 and fourth layer 240 are doped with aluminum and second layer 220 and third layer 230 are doped with silicon. "Si—Al—Si—Al" or "Al—Si—Al—Si" refers to a ferroelectric film structure where first layer 210 and third layer 230 are doped with silicon and second layer 220 and forth layer 240 are doped with aluminum. The ratio of hafnium oxide to dopant (e.g., aluminum, silicon) in these films is approximately 24:1.

Figure 5:
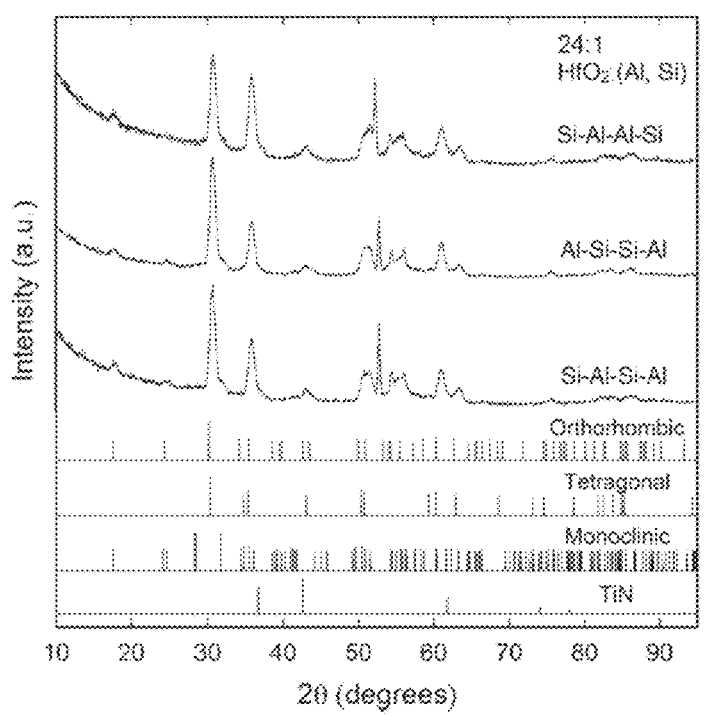
FIG. 5 is a plot of intensity versus 2θ showing profiles of doped hafnium oxide films collected using grazing incidence X-ray diffraction (GIXRD).

FIG. 5 is a plot of intensity versus 2θ showing profiles for the films Si—Al—Al—Si, Al—Si—Si—Al, and Si—Al—Si—Al annealed at 800° C. collected using grazing incidence X-ray diffraction (GIXRD). Representative profiles for orthorhombic, tetragonal, and monoclinic are also shown in FIG. 5. As shown in FIG. 5, the profiles of the three film structures show presence of the orthorhombic crystal phase, although other phases may be present in each of these three films. The full width at half maximum (FWHM) of the t(111)/o(211) diffraction peak at approximately 30° is largest in the Si—Al—Al—Si film and smallest in the Si—Al—Si—Al film.

Figure 6C:
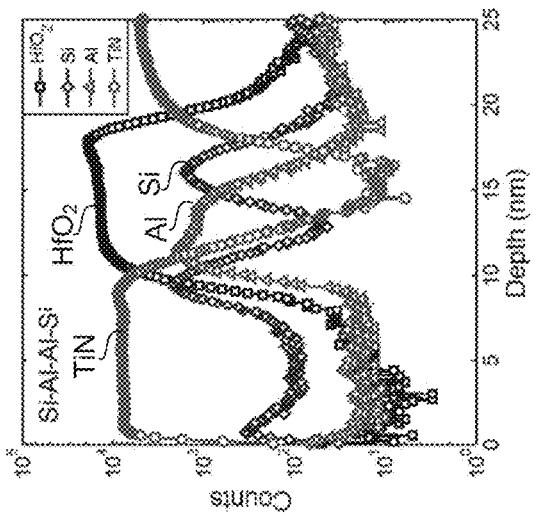
FIGS. 6A, 6B, and 6C are plots showing depth profiles of aluminum and silicon doped layers of a hafnium oxide film for different exemplary devices.
Figure 6B:
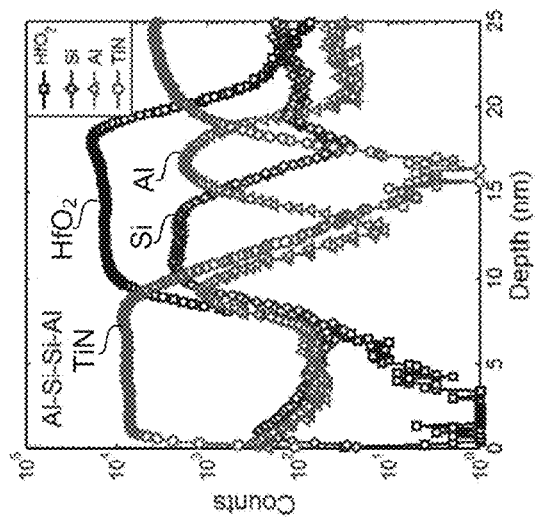
Figure 6A:
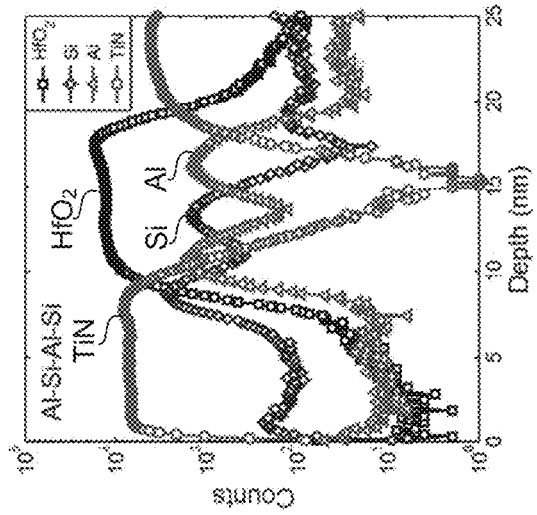

FIGS. 6A, 6B, and 6C are plots showing depth profiles for devices with the films Al—Si—Al—Si, Al—Si—Si—Al, and Si—Al—Al—Si annealed at 800° C., respectively. These profiles are collected using time-of-flight secondary ion mass spectrometry (TOF-SIMS). As shown in FIGS. 6A, 6B, and 6C, the thickness of the hafnium oxide is approximately 10 nm and layers of aluminum doped hafnium oxide and silicon doped hafnium oxide are within the range of approximately 2 nm to approximately 6 nm. Titanium nitride (TiN) is formed on either side of the hafnium oxide and may have a thickness in the range of approximately 3 nm to approximately 12 nm.

Figure 7A:
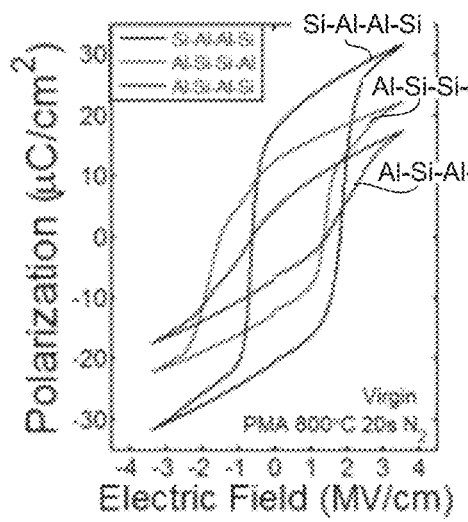
FIGS. 7A, 7B, 7C, and 7D are plots of polarization versus electric field for different exemplary devices that have doped hafnium oxide films.
Figure 7B:
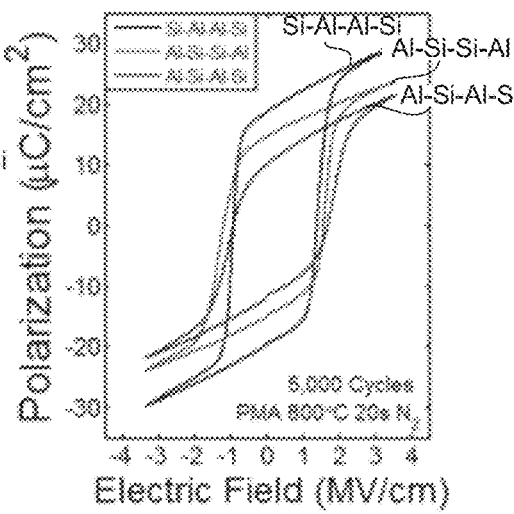
Figure 7C:
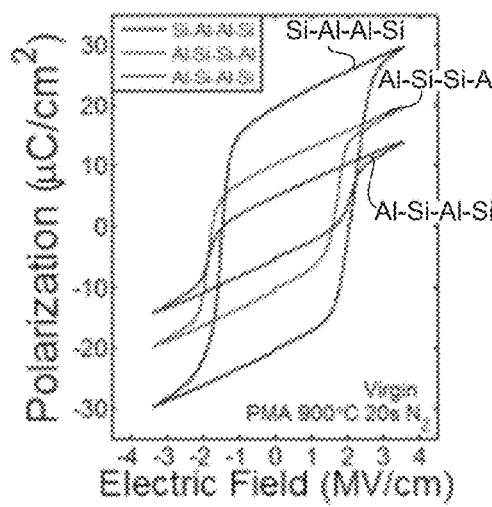
Figure 7D:
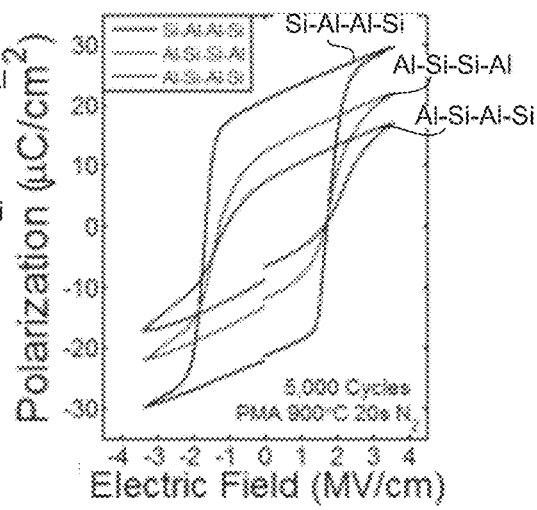

FIGS. 7A, 7B, 7C, and 7D are plots of polarization versus electric field for devices with the films Si—Al—Al—Si, Al—Si—Si—Al, and Al—Si—Al—Si at different annealing conditions and/or cycle number. FIGS. 7A and 7B are plots of polarization versus electric field for the three doped hafnium oxide film structures annealed at 800° C. for 20 seconds. FIG. 7A is a plot of polarization versus electric field before cycling of the devices having films Si—Al—Al—Si, Al—Si—Si—Al, and Al—Si—Al—Si. FIG. 7B is a plot of polarization versus electric field after 5,000 cycles of the devices. FIGS. 7C and 7D are plots of polarization versus electric field for the three doped hafnium oxide film structures annealed at 900° C. for 20 seconds. FIG. 7C is a plot of polarization versus electric field before cycling of devices with films Si—Al—Al—Si, Al—Si—Si—Al, and Al—Si—Al—Si. FIG. 7D is a plot after 5,000 cycles of the devices. For all three films, cycling of the films improves ferroelectric properties including remanent polarization. The characteristics of the Si—Al—Al—Si doped hafnium oxide film exhibit a remanent polarization of approximately 19 μC/cm² which increases by approximately 1 μC/cm² after cycling. For Al—Si—Si—Al, the remanent polarization before cycling is approximately 13 μC/cm² which increases by approximately 2 μC/cm² after cycling. For Al—Si—Al—Si, the remanent polarization before cycling is approximately 7 μC/cm² which increases by approximately 5 μC/cm² after cycling.

Figure 8A:
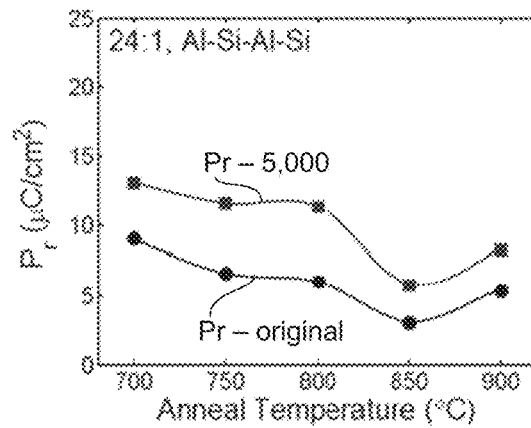
FIGS. 8A, 8B, and 8C are plots of remanent polarization as a function of anneal temperature before cycling and after 5,000 cycles for different exemplary devices that have doped hafnium oxide films.
Figure 8B:
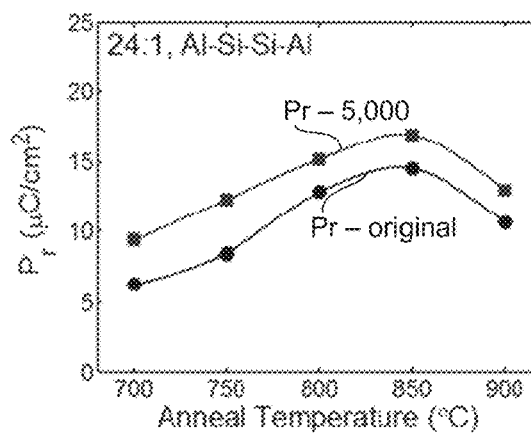
Figure 8C:
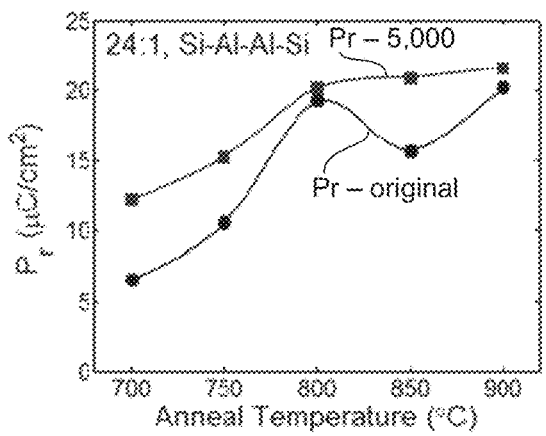

FIGS. 8A, 8B, and 8C are plots of remanent polarization as a function of anneal temperature before cycling and after 5,000 cycles for devices with films Al—Si—Al—Si, Al—Si—Si—Al, and Si—Al—Al—Si, respectively. The dots indicate remanent polarization values before cycling, and the squares indicate remanent polarization after 5,000 cycles. These plots show that the annealing temperature can have different effects on the ferroelectric properties, depending on the arrangement of the layers of dopant in the ferroelectric film.

Figure 9:
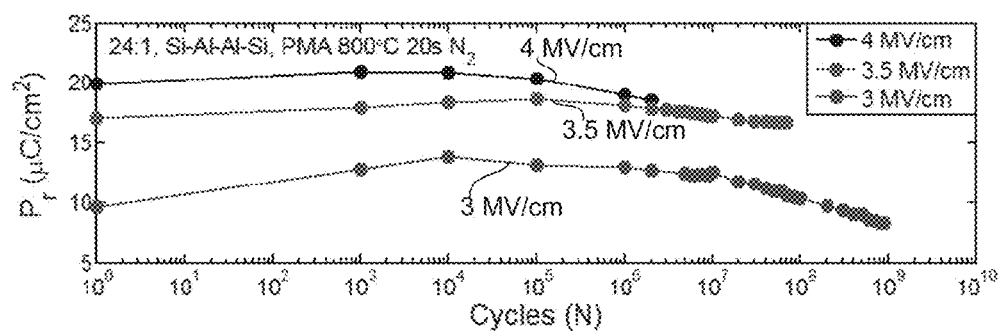
FIG. 9 is a plot of remanent polarization as a function of cycle number for a device having a doped hafnium oxide film with a Si—Al—Al—Si structure.

FIG. 9 is a plot of remanent polarization as a function of cycle number for a device having a doped hafnium oxide film with a Si—Al—Al—Si structure that was annealed at 800° C. for 20 seconds. FIG. 9 shows endurance cycling characteristics for different electric field strengths (3 MV/cm, 3.5 MV/cm, 4 MV/cm) applied during cycling. At 3.5 MV/cm, a remanent polarization greater than approximately 15 µC/cm$^2$ is observed up to 10$^8$ cycles before there is breakdown of the device. Breakdown is accelerated at 4 MV/cm and occurs after approximately 10$^6$ cycles. Cycling at 3 MV/cm delays breakdown until approximately 10$^9$ cycles. These cycling characteristics may be suitable for memory device applications, such as FRAM, where having a device capable of a large number of read and write cycles is desired.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

What is claimed is:

1. A method of forming an electronic device comprising:
    forming first, second and third layers of materials on a substrate, wherein each of the first, second and third layers of materials comprises hafnium and oxygen;
    forming a first dopant layer between the first and second layers of materials;
    forming a second dopant layer between the second and third layers of materials, wherein second dopant layer is different from the first dopant layer;
    heating the first, second and third layers of materials and the first and second dopant layers to form a ferroelectric film;
    forming a first conductive layer on a first surface of the ferroelectric film; and
    forming a second conductive layer on a second surface of the ferroelectric film.

2. The method of claim 1, wherein:
    the first dopant layer comprises a first dopant, the second dopant layer comprises a second dopant, and the first dopant has smaller ionic radius than the second dopant.

3. The method of claim 1, wherein:
    the first layer and the third layer of materials have a larger lattice volume than the second dopant layer.

4. The method of claim 1, wherein:
    the first dopant layer is doped with silicon, and the second dopant layer is doped with aluminum.

5. A method of forming an electronic device in claim 1, further comprising:
    forming a fourth layer of material comprising hafnium and oxygen under the second conductive layer;
    forming a third dopant layer between the third and fourth layers of hafnium and oxygen, wherein the third dopant layer is different than the first and second dopant layers; and
    heating the fourth layer of material at the time heating the first, second and third layers.

6. The method of claim 5, further comprising forming a third dopant layer, wherein the first dopant layer is at a first depth from the second surface of the ferroelectric film, the second dopant layer is at a second depth from the top surface, and the third dopant layer is at a third depth from the second surface of the ferroelectric film such that the second dopant layer is positioned between the first dopant layer and the third dopant layer.

7. The method of claim 6, wherein:
    the first depth is between approximately 0.5 nm and approximately 4 nm,
    the second depth is between approximately 3 nm and approximately 9 nm, and
    the third depth is between approximately 8 nm and approximately 11 nm.

8. The method of claim 6, wherein each of the first dopant layer, the second dopant layer, and the third dopant layer has a thickness between approximately 0.5 nm and approximately 5 nm.

9. The method of claim 5, wherein each of the first, second, and third dopant layers comprise dopants selected from the group consisting of silicon, aluminum, yttrium, zirconium, gadolinium, strontium, and lanthanium, titanium, and tantalum.

10. The method of claim 1, wherein the first dopant layer is separated from a second dopant layer by an undoped layer within the ferroelectric film.

11. The method of claim 1, wherein the ferroelectric film has a hafnium to dopant ratio between 50:1 and 5:1.

12. The method of claim 1, wherein the ferroelectric film has an orthorhombic phase.

13. The method of claim 6, wherein the first dopant layer and the third dopant layer have a larger concentration of a first dopant than a second dopant, and the second dopant layer has a larger concentration of the second dopant than the first dopant.

14. The method of claim 6, wherein forming the ferroelectric film comprises applying atomic layer deposition and/or chemical vapor deposition; wherein each of the first, second and third layers of materials comprises a plurality of monolayers of hafnium and oxygen; and wherein each of the first, second and third dopant layers comprises a plurality of monolayers dopants.

15. The method of claim 1, wherein heating to form the ferroelectric film comprises heating the film to a temperature between approximately 450° C. and approximately 1050° C.

16. The method of claim 1, wherein the first conductive layer and the second conductive layer include a conductive metal.

* * * * *